(12) United States Patent
Donoso et al.

(10) Patent No.: US 7,319,920 B2
(45) Date of Patent: Jan. 15, 2008

(54) METHOD AND APPARATUS FOR SELF-CALIBRATION OF A SUBSTRATE HANDLING ROBOT

(75) Inventors: Bernardo Donoso, San Jose, CA (US); Yeuk-Fai E. Mok, San Francisco, CA (US); Vincent E. Burkhardt, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 622 days.

(21) Appl. No.: 10/705,175

(22) Filed: Nov. 10, 2003

(65) Prior Publication Data

US 2005/0102064 A1    May 12, 2005

(51) Int. Cl.
G05B 19/04 (2006.01)
G05B 19/18 (2006.01)
G05B 19/00 (2006.01)

(52) U.S. Cl. ............... 700/254; 700/245; 414/757; 414/816; 536/25.3

(58) Field of Classification Search ............... 700/245, 700/254, 258; 33/250, 613, 644; 414/936; 702/94
See application file for complete search history.

(56) References Cited

U.S. PATENT DOCUMENTS

| | | | |
|---|---|---|---|
| 6,256,555 B1 | 7/2001 | Bacchi et al. | |
| 6,275,748 B1 | 8/2001 | Bacchi et al. | |
| 6,290,865 B1 * | 9/2001 | Lloyd et al. | 216/92 |
| 6,436,267 B1 * | 8/2002 | Carl et al. | 205/186 |
| 6,453,214 B1 | 9/2002 | Bacchi et al. | |
| 6,537,011 B1 * | 3/2003 | Wang et al. | 414/217 |
| 6,618,645 B2 | 9/2003 | Bacchi et al. | |
| 6,760,976 B1 * | 7/2004 | Martinson et al. | 33/520 |
| 2003/0000844 A1 * | 1/2003 | Carl et al. | 205/183 |

FOREIGN PATENT DOCUMENTS

| | | |
|---|---|---|
| JP | 2001-210692 | 1/1998 |
| JP | 10006262 | 8/2001 |

* cited by examiner

Primary Examiner—Thomas Black
Assistant Examiner—McDieunel Marc
(74) Attorney, Agent, or Firm—Dugan & Dugan, PC

(57) ABSTRACT

A substrate-handling robot which serves a processing tool such as a plating tool may be automatically controlled by a controller to perform a self-calibration procedure. As part of the procedure, an end effector of the robot is moved to interact with sensors provided on a calibration fixture that is positioned in a substrate placement location for which the calibration procedure is performed. The calibration fixture may have an opening formed therein to allow movement of the robot end effector within the calibration fixture. Sensor light beams generated by the sensors may interact with the end effector during the automatic calibration process so as to determine calibration data for the substrate placement location.

27 Claims, 12 Drawing Sheets

METHOD AND APPARATUS FOR SELF-CALIBRATION OF A SUBSTRATE HANDLING ROBOT

FIELD OF THE INVENTION

The present invention is concerned with semiconductor device manufacturing, and is more particularly concerned with installation and calibration of robots which handle semiconductor substrates.

BACKGROUND OF THE INVENTION

Semiconductor device manufacturing generally entails performing a number of processes with respect to a substrate such as a silicon wafer or a glass plate. In connection with such processes, substrates typically are delivered to and removed from numerous processing locations. In order to minimize risk of damage to or contamination of substrates, much, if not all, of the handling of the substrates during semiconductor device manufacturing is automated (e.g., via the use of robots).

When a robot that is used for automated handling of substrates is installed, a calibration operation usually is performed. The calibration operation allows a controller for the robot to accurately position and/or otherwise control the robot (e.g., to ensure precise hand off of substrates to, or recovery of substrates from, a processing location or a transfer location at which the substrates are made available to the robot). Conventional techniques for calibrating substrate-handling robots can be time- and labor-intensive, and thus expensive and inconvenient. Accordingly, a need exists for methods and apparatus for improving the calibration of robots employed during semiconductor device manufacturing.

SUMMARY OF THE INVENTION

In a first aspect of the invention, a first method for calibrating a robot is provided. The first method includes the steps of (1) placing a calibration fixture in a substrate placement location, the calibration fixture including at least one sensor; (2) causing an end effector of a substrate handling robot to interact with the at least one sensor; and (3) based on the interaction between the end effector and the at least one sensor, determining calibration data for the substrate handling robot.

In a second aspect of the invention, a second method for calibrating a robot is provided. The second method includes the steps of (1) providing a calibration fixture having a body with an opening that extends from an edge of the body to at least a center of the body, the calibration fixture including a plurality of sensors mounted in the body so as to define respective light beam paths across the opening; and (2) placing the calibration fixture in a substrate placement location of a substrate processing station. The second method further includes the steps of (1) establishing a signal path between the sensors and a controller that is operatively coupled to a substrate handling robot; (2) controlling the substrate handling robot to move an end effector of the substrate handling robot so as to selectively obstruct at least one of the light beam paths; and (3) receiving signals from at least one of the sensors, the received signals indicating the obstructing of the at least one of the light beam paths by the end effector.

On the basis of the received signals, hand-off location data for the substrate processing station is determined. The determined hand-off location data includes (i) data which defines an elevation parameter for the substrate handling robot; (ii) data which defines an extension parameter for the substrate handling robot; (iii) data which defines a rotation parameter for the substrate handling robot; and/or (iv) data which defines a roll angle (or flip angle) for the substrate handling robot. The second method further includes storing the hand-off location data.

Numerous other aspects are provided, as are systems, apparatus and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

In accordance with at least one aspect of the invention, a calibration fixture is placed in a substrate placement location such as a processing or transfer location. The calibration fixture includes sensors adapted to detect the presence of an end effector of a robot that is to be calibrated relative to the substrate placement location. The fixture may be connected to a controller for the robot, and signals from the sensors provided to the controller. During calibration of the robot, the controller directs the robot to move the end effector so as to interact with the sensors of the calibration fixture. On the basis of the interaction between the end effector and the sensors of the calibration fixture, the controller may determine data indicative of substrate hand-off positions for the substrate placement location (e.g., elevation, extension, rotation and/or flip data for the end effector). Such hand-off position data may be stored by the controller, and the robot thus calibrated relative to the substrate placement location. The above calibration procedure may be performed quickly, and with little or no operator involvement (e.g., automatically) as described further below.

In one particular embodiment of the invention, the calibration procedure utilizes the calibration fixture in conjunction with one or more software programs that control robot motions based on information collected from the sensors of the calibration fixture. For example, an operator may place (e.g., manually) the calibration fixture at a desired hand-off or other substrate placement location. The operator then may activate/initiate an autocalibration routine (e.g., via a touch screen or some other user interface) for the hand-off location where the calibration fixture has been placed. In response thereto, the one or more software programs may direct an arm of the robot to the hand-off location, and the autocalibration routine may collect and interpret information provided by the sensors of the calibration fixture as the sensors interact with an end effector of the robot arm. For example, the autocalibration routine may direct the robot arm to move the end effector toward one or more target positions. In at least one embodiment of the invention, the autocalibration routine determines data in the following order (1) flip level data; (2) rotation and extension (e.g., centering) data; (3) z-up data; and (4) z-down data as described further below. Thereafter, the autocalibration routine may determine pitch angle of the end effector and/or confirm that the pitch angle is within a predetermined range. Other orders for data collection may be employed. Collected data is stored for later use; and the autocalibration procedure may be repeated for each hand-off location that requires calibration.

Figure 1:
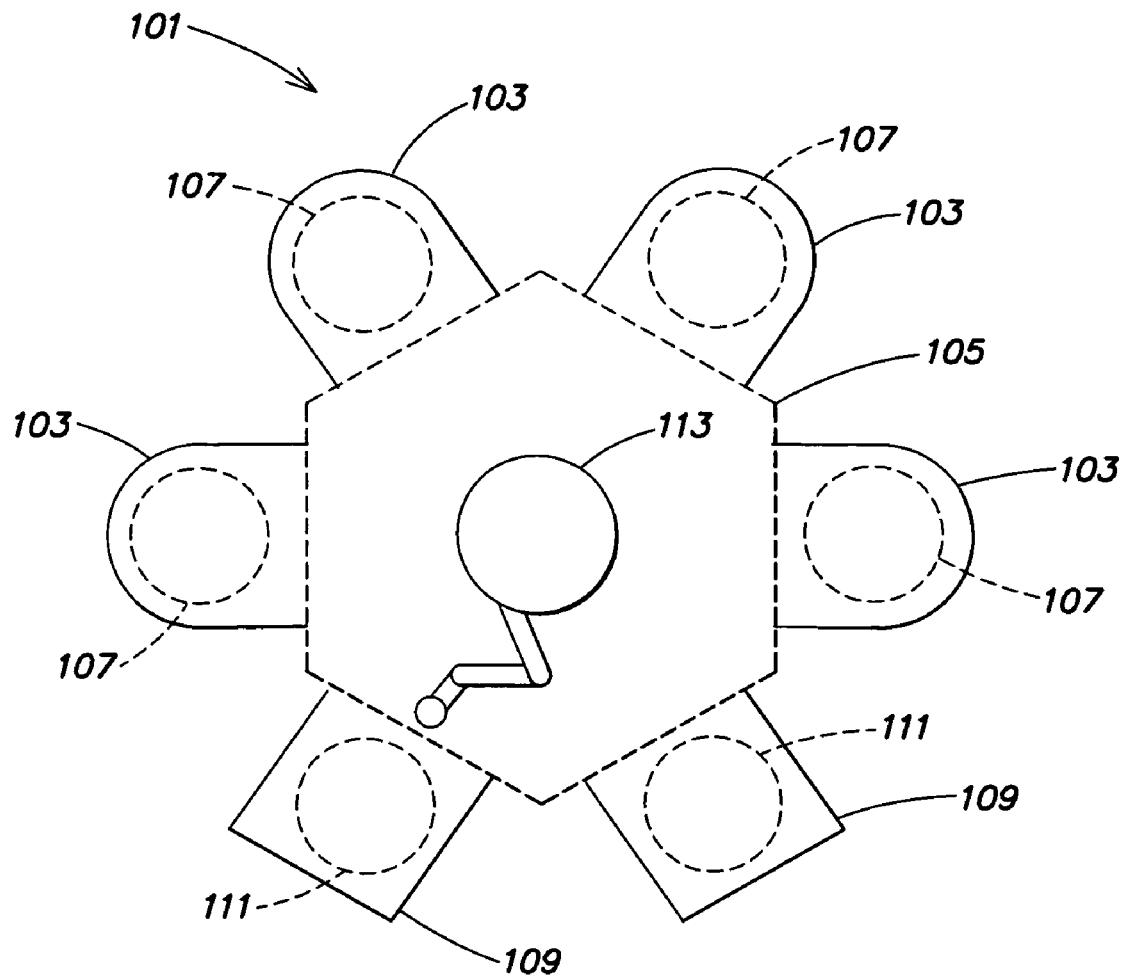
FIG. 1 is a schematic plan view of a conventional substrate processing apparatus.

FIG. 1 is a schematic plan view of a conventional processing apparatus with which the present invention may be employed. Reference 101 generally indicates the conventional substrate processing apparatus. The substrate processing apparatus 101 may comprise, for example, an electrochemical plating tool such as the iECP Tool commercially available from the assignee of the present application, Applied Materials, Inc. The present invention also may be employed with other processing apparatus.

The substrate processing apparatus 101 includes a number of processing chambers (or modules) 103 coupled to a central transfer chamber (or mainframe) 105. The processing chambers 103 may include, for example, one or more plating cells, bevel cleaners or other types of cleaning chambers and/or spin rinse driers. Other processing chambers also may be employed, depending on the type of substrate processing to be performed within the substrate processing apparatus 101. Each of the processing chambers 103 includes a substrate processing location 107 in or on which a substrate is held during processing in the processing chamber 103. One or more of the substrate processing locations 107 may comprise a pocket in which a substrate is received.

Also coupled to the central transfer chamber 105 is one or more loading stations 109 for supplying substrates to and removing substrates from the substrate processing apparatus 101. Each loading station 109 includes a transfer location 111 which is suitable for holding a substrate while the substrate is waiting to be processed by the substrate processing apparatus 101 or to be removed from the substrate processing apparatus 101. A substrate-handling robot 113 (located within the central transfer chamber 105) is adapted to transfer substrates between the loading stations 109 and the processing chambers 103.

Figure 2:
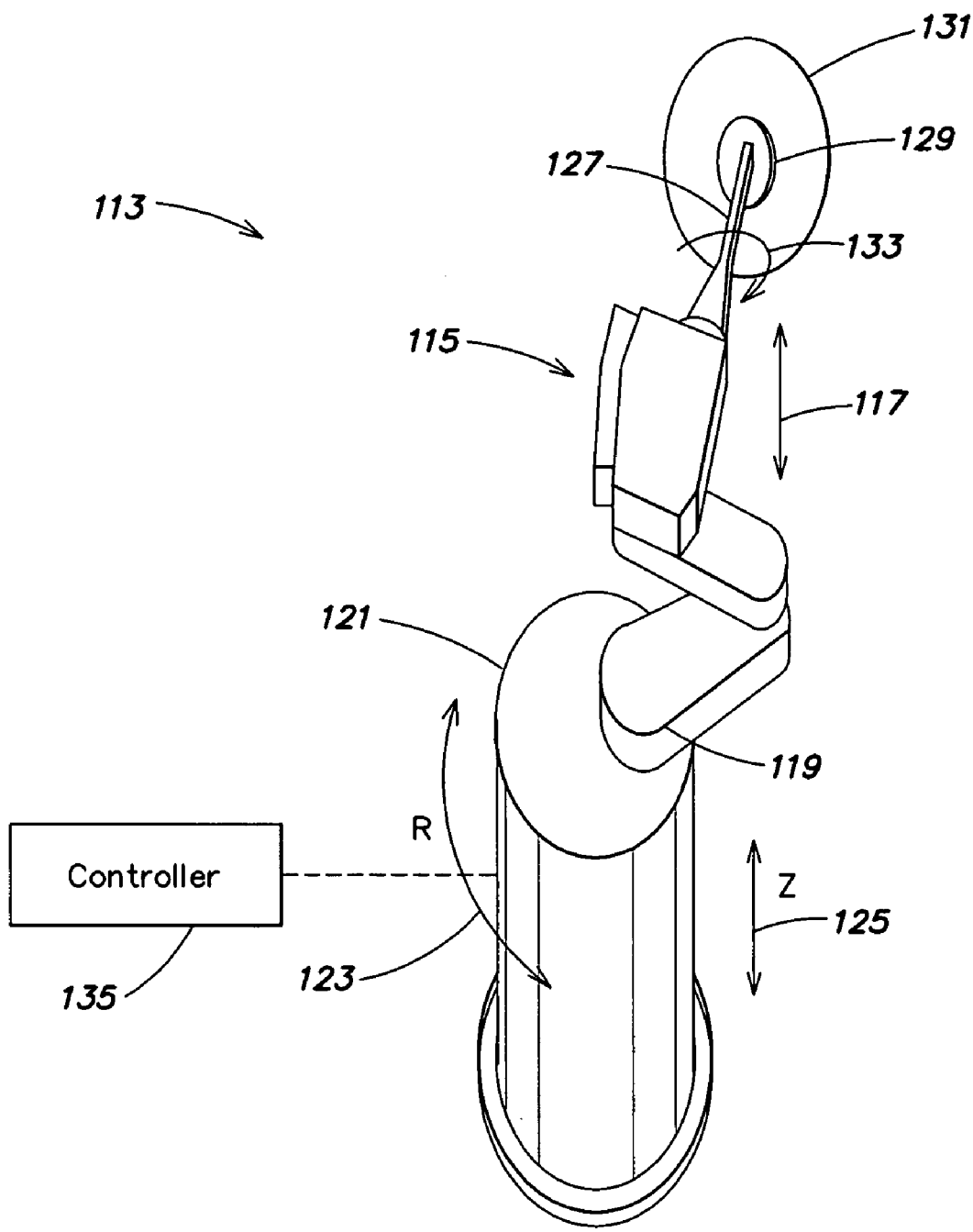
FIG. 2 is a perspective view, taken from above, of a conventional substrate-handling robot.

FIG. 2 is a perspective view of a conventional substrate-handling robot 113 of a type suitable for use in the substrate processing apparatus 101 of FIG. 1. The robot 113 includes a jointed arm 115 which is adapted to be extended or retracted along a radial axis as indicated by double-arrow 117. The jointed arm 115 has a first end 119 mounted on a hub 121. The hub 121 can be rotated, as indicated by arrow 123, around a vertical axis, to change the orientation of the jointed arm 115 in a horizontal plane. The hub 121 also is adapted to be lifted and lowered, as indicated by arrow 125, to change the elevation (Z-axis adjustment) of the jointed arm 115.

The arm 115 has a second end 127 at which an end effector 129 is mounted. The end effector 129 is adapted to hold a substrate, such as substrate 131. The end effector 129 may comprise any suitable end effector. For example, the end effector 129 may be adapted to hold a substrate 131 by suction, as described, for example, in commonly assigned U.S. patent application Ser. No. 09/524,997, titled "self positioning vacuum chuck" and filed Mar. 14, 2000, which is hereby incorporated by reference herein in its entirety.

The second end 127 of the arm 115 may be arranged to rotate the end effector 129 (e.g., about a horizontal axis), as indicated by arrow 133 so that the end effector 129 and the substrate 131 held thereby may be rotated by 180° or "flipped". Substrate flipping may be necessary if processing of the substrate 131 occurs with the substrate 131 facing upward in one or more of the processing chambers 103 (FIG. 1), and facing downward in one or more of the other processing chambers 103.

A controller 135, such as a microprocessor or the like, is associated with the robot 113 and is programmed to control movement of the jointed arm 115. For example, the controller 135 may control the arm 115 so as to move the arm 115 through one or more predetermined motions that (1) deliver ("hand-off") substrates to the substrate processing locations 107 and the transfer locations 111 of the substrate processing apparatus 101 of FIG. 1; and (2) pick up substrates from the substrate processing locations 107 and transfer locations 111. As is familiar to those who are skilled in the art, the movements of the arm 115 may be performed automatically based on, for example, data stored in the controller 135. In particular, data such as elevation (Z-axis) data, extension data, rotation data and/or flip data may be stored in the controller 135, and used to determine the exact positions to which the end effector 129 is moved to hand-off substrates to and pick up substrates from the substrate processing locations 107 and the transfer locations 111.

When the robot 113 is installed within the substrate processing apparatus 101 of FIG. 1, the robot 113 must be calibrated to determine the motions employed to deliver substrates to and remove substrates from the substrate processing locations 107 and the transfer locations 111. According to one conventional calibration method, a calibration fixture (not shown) in the form of a solid cylinder of material (having substantially the same diameter as the substrates to be handled by the robot 113) is positioned at one of the substrate processing locations 107 or one of the transfer locations 111. While a first operator observes the end effector 129 (FIG. 2), a second operator employs the controller 135 to move the end effector 129 to a predetermined position proximate the calibration fixture. The first, observing operator directs the second operator to move (e.g., via inputs to the controller 135) the end effector 129 to a hand-off position for the substrate processing location 107 or transfer location 111. Data such as Z-axis (e.g., Z-up and Z-down), extension, rotation and/or flip data relevant to a hand-off is stored by the controller 135. This process is repeated with respect to each of the other substrate processing locations 107 and transfer locations 111 of the substrate processing apparatus 101. While effective, such a robot calibration process is time- and labor-intensive, and consequently may be expensive and inconvenient.

Figure 3:
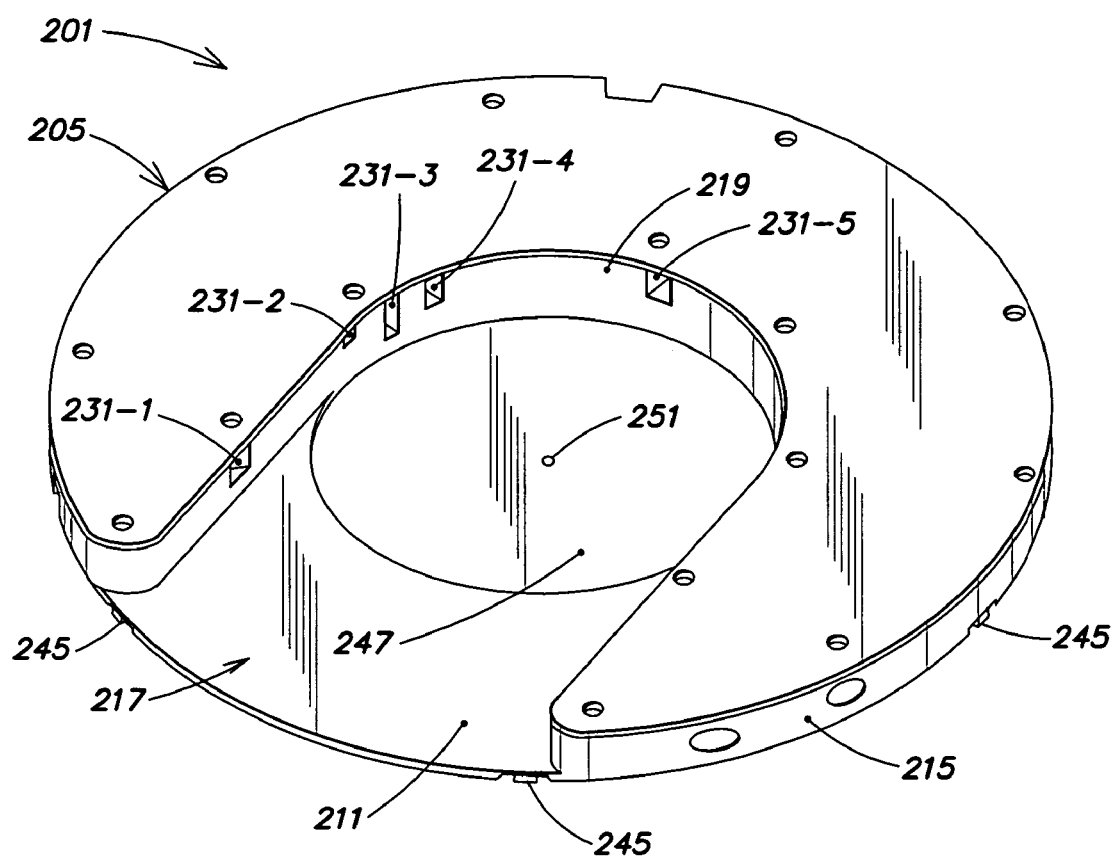
FIG. 3 is a perspective view of a fixture provided in accordance with the invention for use in connection with an inventive method for self-calibrating a substrate-handling robot.
Figure 4:
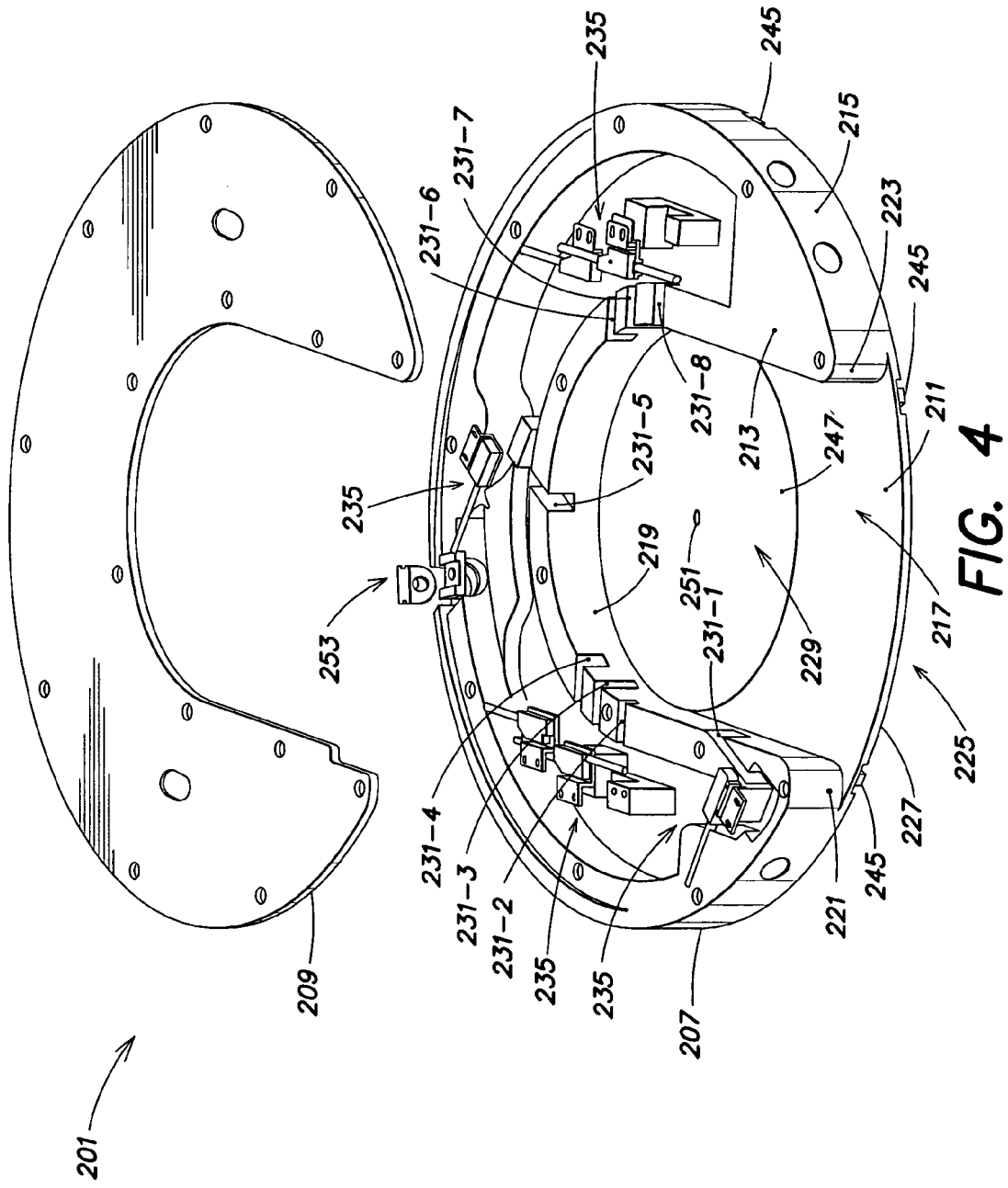
FIG. 4 is an exploded view showing components of the inventive fixture of FIG. 3.
Figure 5:
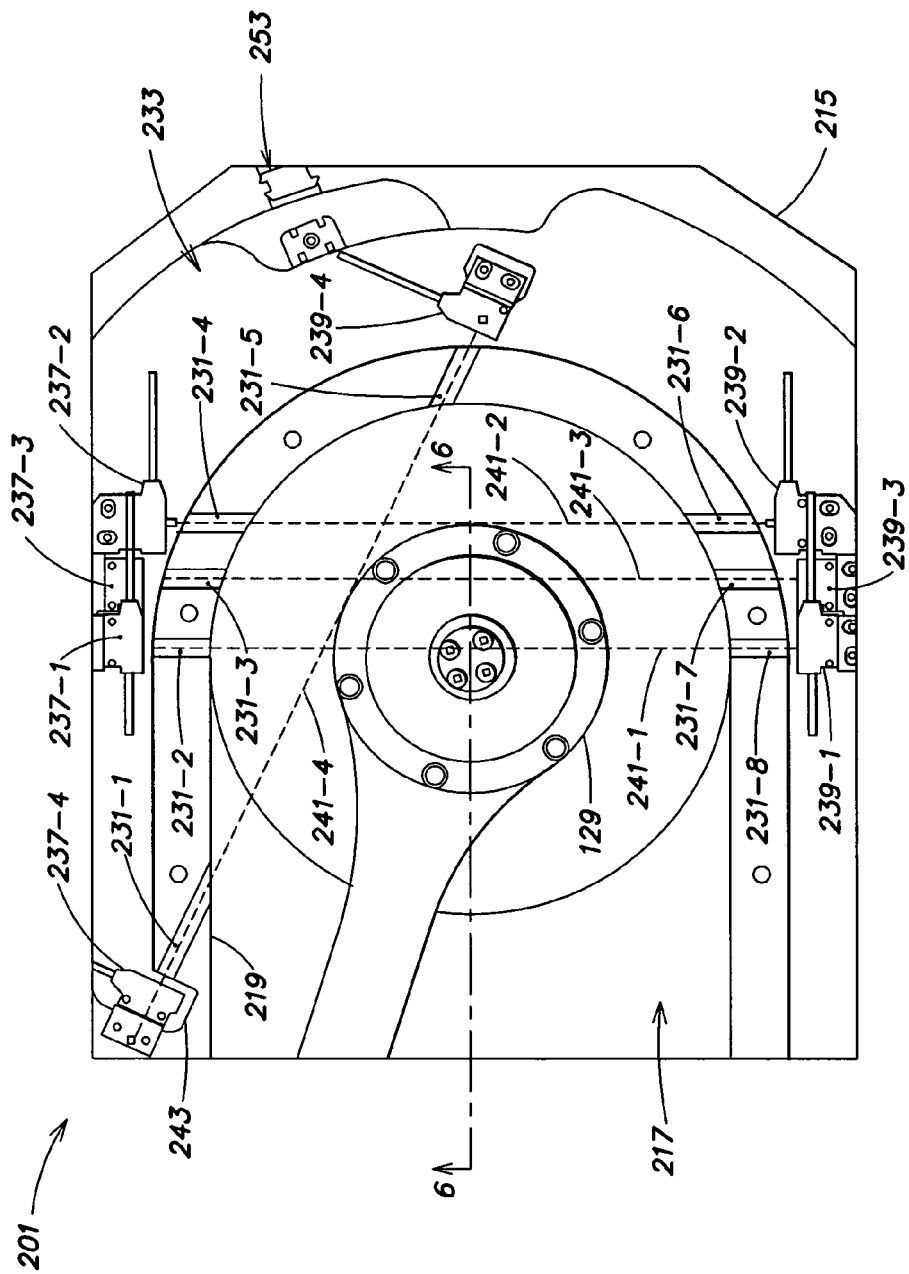
FIG. 5 is a partial, schematic plan view of the inventive fixture of FIG. 3, shown in juxtaposition with an end effector of the conventional robot of FIG. 2.
Figure 6:
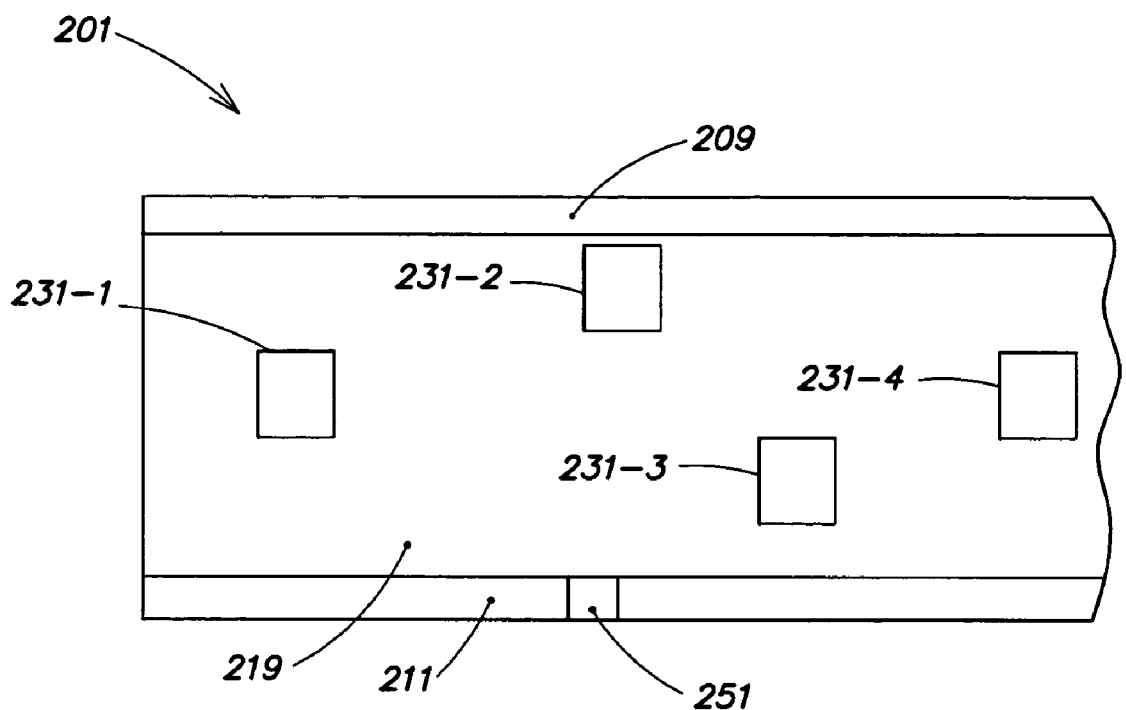
FIG. 6 is a somewhat schematic, partial vertical cross-sectional view, taken along line 6-6 of FIG. 5, showing the inventive fixture in the absence of a robot end effector.
Figure 7:
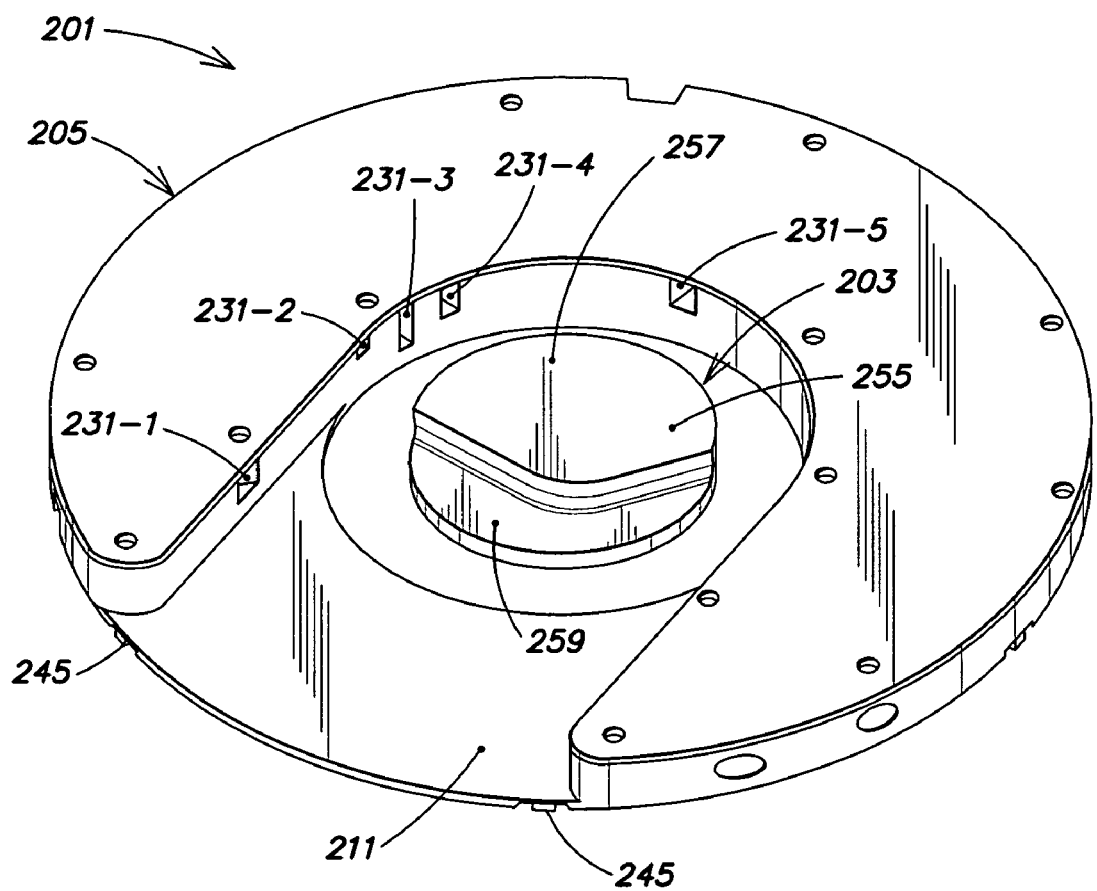
FIG. 7 is a view similar to FIG. 3, showing the inventive fixture with an inventive calibration tool positioned thereon.

Inventive methods and apparatus for calibrating a robot relative to a substrate placement location such as a processing or transfer location will now be described. For example, FIG. 3 is a perspective view of a calibration fixture 201 provided in accordance with the present invention. FIG. 4 is an exploded view of the inventive calibration fixture 201, and FIG. 5 is a schematic, partial plan view showing the inventive calibration fixture 201 in juxtaposition with an end effector of a robot that is being calibrated by using the calibration fixture 201. FIG. 6 is a somewhat schematic cross-sectional view of the calibration fixture 201 taken along line 6-6 of FIG. 5. FIG. 7 is another perspective view of the inventive calibration fixture 201, also showing a sensor calibration tool 203 positioned on a floor of the inventive calibration fixture 201.

With reference to FIGS. 3-7, the inventive calibration fixture 201 includes a body 205 that is generally cylindrically shaped as seen from FIG. 3. The body 205 may include a base 207 and a cover 209, as shown in FIG. 4. The base 207 includes a substantially circular floor portion 211 from which a mounting structure 213 extends. The mounting structure 213 includes a generally cylindrical outer wall 215, the cylindrical extent of which is interrupted by a slot 217 (which is defined by an inner U-shaped wall 219). The slot 217 includes an entrance 225, and extends from a perimeter 227 of the body 205 up to and beyond a central portion 229 of the body 205. As described further below, the slot 217 is provided to accommodate movement therein of the end effector of a robot that is to be calibrated using the inventive calibration fixture 201.

As shown in FIG. 4, a number of openings 231 are formed through the U-shaped wall 219 from the slot 217 to an interior region 233 of the mounting structure 213. In the particular embodiment shown, eight openings 231-1 to 231-8 are provided, although other numbers may be employed. As will be described, the openings 231 are provided to accommodate sensor beam paths that extend across the slot 217.

Mounted within the interior region 233 of the mounting structure 213 are photo sensors generally indicated at 235 in FIG. 4. In particular, and referring to FIG. 5, the photo sensors 235 comprise transmitter-receiver pairs, including:

(a) a first transmitter-receiver pair formed from a first photo transmitter 237-1 and a first photo receiver 239-1;
(b) a second transmitter-receiver pair formed from a second photo transmitter 237-2 and a second photo receiver 239-2;
(c) a third transmitter-receiver pair formed from a third photo transmitter 237-3 and a third photo receiver 239-3; and
(d) a fourth transmitter-receiver pair formed from a fourth photo transmitter 237-4 and a fourth photo receiver 239-4. Other numbers of transmitter-receiver pairs may be employed. In at least one embodiment of the invention, each sensor may comprise a Sunx EX13-EA emitter-receiver available from Sunx, U.S.A., Inc., although other sensors may be employed.

The first photo transmitter 237-1 is mounted in the interior region 233 of the mounting structure 213 adjacent the opening 231-2. The first photo receiver 239-1 is mounted in the interior region 233 of the mounting structure 213 adjacent the opening 231-8. The first photo transmitter 237-1 and the first photo receiver 239-1 thus define a first light beam path 241-1 which passes through the openings 231-2 and 231-8 and crosses the slot 217. The first beam path 241-1 may be used, for example, to determine data indicative of a height (Z-axis) parameter for a hand-off location associated with a substrate placement location in which the calibration fixture 201 is positioned (as described below). As best seen in FIG. 6, the transmitter/receiver pair 237-1 and 239-1 is located at a first height corresponding to the opening 231-2, which is just below the cover 209 of the calibration fixture 201. The transmitter/receiver pair 237-1, 239-1 may be referred to as a z-up sensor (e.g., used to measure z-up data).

Referring again to FIG. 5, the second photo transmitter 237-2 is installed in the interior region 233 of the mounting structure 213 adjacent the opening 231-4. The second photo receiver 239-2 is mounted in the interior region 233 of the mounting structure 213 adjacent the opening 231-6. The second photo transmitter 237-2 and the second photo receiver 239-2 thus define a second light beam path 241-2 that passes through the openings 231-4 and 231-6 and across the slot 217. As will be described, the second light beam path 241-2 may be used to determine extension parameter data for a hand-off location associated with a substrate placement location in which the calibration fixture 201 is positioned.

As best seen in FIG. 6, the receiver/transmitter pair 239-2 and 241-2 is mounted at a lower height (represented by opening 231-4), than the height of the first light beam path 241-1 (which is represented by opening 231-2 in FIG. 6).

Referring again to FIG. 5, the third photo transmitter 237-3 is mounted inside the interior region 233 of the mounting structure 213 adjacent the opening 231-3. The third photo receiver 239-3 is mounted in the interior region 233 of the mounting structure 213 adjacent the opening 231-7. The third photo transmitter 237-3 and the third photo receiver 239-3 thus define a third light beam path 241-3 that passes through the openings 231-3 and 231-7 and across the slot 217. As will be described, the third light beam path 241-3 also may be used to determine Z-axis parameter data in connection with a hand-off location for a substrate placement location in which the calibration fixture 201 is positioned. The third transmitter/receiver pair 237-3, 239-3, represented by the slot 231-3 in FIG. 6, is at a lower height than the height of the second photo transmitter/receiver pair 237-2, 239-2, represented by the slot 231-4 in FIG. 6. (The transmitter/receiver pair 237-3, 239-3 may be referred to as a z-down sensor.) In this manner, the first light beam path 241-1 may be used to determine Z-axis calibration data for an end effector that is in a face-down orientation (e.g., z-up data), whereas the third light beam path 241-3 may be used to determine Z-axis calibration data for an end effector that is in a face-up orientation (e.g., z-down data) as described further below.

Referring again to FIG. 5, the fourth photo transmitter 237-4 is mounted in the interior region 233 of the mounting structure 213 and adjacent the opening 231-1. A notch 243 formed in the inner side of the U-shaped wall 219 adjacent the opening 231-1 accommodates the angled position of the fourth photo transmitter 237-4. The fourth photo receiver 239-4 is positioned in the interior region 233 of the mounting structure 213 adjacent the opening 231-5. The transmitter/receiver pair 237-4, 239-4 thus defines a fourth light beam path 241-4 that passes through openings 231-1 and 231-5 and across the slot 217 at an angle relative to the light beam paths 241-1 to 241-3 (which in the embodiment shown are approximately parallel to one another).

As best seen in FIG. 6, in at least one embodiment of the invention, the transmitter/receiver pair 237-4, 239-4, represented by opening 231-1 in FIG. 6, may be at substantially the same height as the transmitter/receiver pair 237-2, 239-2, represented by the opening 231-4 in FIG. 6. Other embodiments may be employed.

As will be described below, the fourth light beam path 241-4 may be used to determine rotation parameter data for a hand-off location associated with a substrate placement location in which the calibration fixture 201 is positioned.

It will be understood that, with respect to any one or more transmitter/receiver pairs, the positions of the transmitter and receiver may be interchanged. Also, the number of transmitter/receiver pairs provided in the calibration fixture 201 may be more or less than four transmitter/receiver pairs. It will be understood that the height and/or positions of each transmitter/receiver pair will depend on, for example, the physical dimensions/characteristics of the end effector of the robot arm that is being calibrated. Further features of the calibration fixture 201 will now be described.

The generally cylindrical body 205 of the calibration fixture 201 preferably has a diameter selected such that the body 205 substantially fills a substrate-receiving pocket (e.g., the substrate processing location 107 of FIG. 1) of a processing chamber or module 103. For example, if the calibration fixture 201 is to be used to calibrate a robot for a processing apparatus adapted to process 300 millimeter wafers, in at least one embodiment of the invention, the diameter of the body 205 may be about 300.2 millimeters and/or the height of the calibration fixture may be about 29 mm. If the calibration fixture 201 is to be used for calibrating a processing apparatus adapted to process 200-millimeter wafers, then the diameter of the body 205 may be about 200.2 millimeters and/or the height of the calibration fixture may be about 24 mm. Other tolerances and/or heights may be employed.

The calibration fixture 201 may include a mechanism for centering the calibration fixture 201 relative to a substrate placement location (such as one of the substrate processing locations 107 or substrate transfer locations 111) comprising, for example, one or more compliant members such as O-rings 245 (FIGS. 3 and 4) mounted along the periphery of the floor portion 211 of the base 207 of the body 205. For example, in one embodiment, six O-rings 245 (of which only three are visible in the drawings) may be provided at 60-degree intervals around the circumference of the floor 211. Each O-ring 245 may be dimensioned and peripherally positioned so as to press against a corresponding portion of a pocket wall, resulting in an equal and opposite force being applied to the calibration fixture 201, such that the collective action of the peripherally-spaced O-rings 245 on the calibration fixture 201 may effectively center the calibration fixture 201 within the pocket. Other centering mechanism configurations may be employed.

A recess 247 (FIG. 3) may be formed in an upper surface of the floor portion 211 of the body 205 to provide additional space for Z-axis direction maneuvering of a robot end effector relative to the calibration fixture 201 (described below); and a through-hole 251 (FIG. 3) may be provided in the floor portion 211 of the body 205 for positioning the sensor calibration tool 203 (FIG. 7) relative to the calibration fixture 201 (described below).

With reference to FIGS. 4 and 5, a signal port 253 may be provided along the periphery of the body 205 (e.g., substantially opposite the entrance 225 of the slot 217, although other locations may be employed). The purpose of the signal port 253 is to allow connection between the calibration fixture 201 and a signal cable which may carry sensor signals to a robot controller during calibration operations (described below). In order to simplify the drawing, wiring between the photo sensors 235 and the signal port 253 is not shown. A wireless communication path between the sensors 235 and the robot controller also may be employed.

Proper operation of the calibration fixture 201 requires that the sensors 235 be properly mounted, preferably within a narrow tolerance, in the fixture body 205. The sensor calibration tool 203 (FIG. 7) may be utilized to calibrate the positions of the sensors 235 when the sensors 235 are installed on the fixture body 205. For example, the sensor calibration tool 203 may be used to determine that one or more of the sensors 235 is improperly mounted on the fixture body 205, assist in adjustments of improperly mounted sensors 235 to proper mounting positions, and/or determine that the sensors 235 are in proper mounting positions after such adjustments, after which the sensor calibration tool 203 may be removed.

With reference to FIG. 7, in at least one exemplary embodiment, the sensor calibration tool 203 is generally disc shaped and has a two-level upper surface 255. Specifically, the upper surface 255 includes an upper level 257 and a lower level 259. The sensor calibration tool 203 has a thickness, in the region of the upper level 257 that substantially aligns with the height for the first light beam path 241-1. The thickness of the sensor calibration tool 203 in the region of the lower level 259 substantially aligns with the height for the third light beam path 241-3. In at least one embodiment of the invention, the upper level 257 of the sensor calibration tool 203 is slightly inclined (e.g., varying about 0.2 millimeters from its highest point to its lowest point in one embodiment). Similarly, the lower level 259 may be slightly inclined (e.g., varying about 0.2 millimeters from its highest point to its lowest point in one embodiment).

The diameter of the sensor calibration tool 203 substantially corresponds to the diameter of the end effector of the robot to be calibrated. An alignment pin (not shown) may be provided that extends downwardly from an under side of the sensor calibration tool 203. In at least one embodiment of the invention, the alignment pin is positioned slightly off center (e.g., about 0.2 millimeters from the center of the sensor calibration tool 203), e.g., to provide the possibility of an eccentric rotation of the sensor calibration tool 203 about the alignment pin, useful for calibration purposes (as described below) in a manner that concentric rotation would not permit. The sensor calibration tool 203 may be positioned on the floor portion 211 of the body 205 of the calibration fixture 201 by inserting the alignment pin on the under side of the sensor calibration tool 203 into the through-hole 251 of the calibration fixture 201 (FIGS. 3, 4 and 6 in the floor portion 211).

To determine whether the sensor (transmitter-receiver pair 237-1, 239-1) which corresponds to the first light beam path 241-1 has been mounted at the appropriate height in the body 205 of the calibration fixture 201, the upper level 257 of the sensor calibration tool 203 is rotated about the alignment pin (not shown) of the sensor calibration tool 203 through the light beam output by the transmitter 237-1. If the light beam output by the transmitter 237-1 is blocked part of the time during the rotation of the sensor calibration tool 203 (e.g., when the highest portion of the upper level 257 crosses the light beam path 241-1), but not blocked the remainder of the time, then the height of the transmitter-receiver pair 237-1, 239-1 is properly calibrated. If the light beam of the transmitter 237-1 is not blocked at all during rotation of the sensor calibration tool 203, then the transmitter-receiver pair 237-1, 239-1 is too high; if the light beam of the transmitter 237-1 is blocked all the time during the rotation of the sensor calibration tool 203, then the transmitter-receiver pair 237-1, 239-1 is too low.

A similar determination may be made with respect to the sensor (transmitter-receiver pair 237-3, 239-3) which corresponds to the third light beam path 241-3 by rotating the lower level 259 of the sensor calibration tool 203 through the light beam output by the transmitter 237-3. Breaking the light beam output by the transmitter 237-3 during part but not all of the rotation of the lower level 259 of the sensor calibration tool 203 through the third light beam path 241-3 indicates proper height adjustment for the transmitter-receiver pair 237-3, 239-3. No interruption in the light beam indicates that the transmitter-receiver pair 237-3, 239-3 is too high; and constant interruption of the light beam indicates that the transmitter-receiver pair 237-3, 239-3 is too low.

The sensor calibration tool 203 also may be employed to determine whether the sensors (transmitter-receiver pairs 237-2, 239-2 and 237-4, 239-4) corresponding to the second and fourth light beam paths 241-2 and 241-4 are properly oriented and positioned (e.g., in a horizontal plane). As described further below, appropriate positioning of these transmitter-receiver pairs causes the light beams output by the transmitters 237-2, 237-4 to be tangential to the end effector 129 (FIG. 5) when the end effector 129 is centered relative to the calibration fixture 201 (e.g., when the center of the end effector 129 is aligned with the through-hole 251 (FIG. 3)). To determine whether the transmitter-receiver pairs for the second and fourth light beam paths 241-2 and 241-4 are properly positioned, the outer wall 215 of the sensor calibration tool 203 may be rotated through the light beams output by the transmitters 237-2, 237-4.

With regard to the second light beam path 241-2 (e.g., the extension sensor), if the outer wall 215 of the sensor calibration tool 203 obstructs the light beam output by the transmitter 237-2 along the second light beam path 241-2 during part but not all of the rotation of the sensor calibration tool 203, then the transmitter-receiver pair 237-2, 239-2 is properly positioned and oriented. If the light beam of the transmitter 237-2 is not obstructed at all during rotation, then the transmitter-receiver pair 237-2, 239-2 is too far from the entrance to the slot 217. If the light beam of the transmitter 237-2 is constantly obstructed during rotation of the sensor calibration tool 203, then the transmitter-receiver pair 237-2, 239-2 is too close to the entrance of the slot 217.

Similarly, with respect to the transmitter-receiver pair 237-4, 239-4 (e.g., the rotation sensor) corresponding to the fourth light beam path 241-4, if the outer wall 215 of the sensor calibration tool 203 obstructs the light beam output by the transmitter 237-4 along the fourth light beam path 241-4 during part, but not all, of the rotation of the sensor calibration tool 203, then the transmitter-receiver pair 237-4, 239-4 is properly positioned and oriented. If the light beam is not broken at all during the rotation of the sensor calibration tool 203, then the transmitter-receiver pair 237-4, 239-4 is radially spaced (in a direction perpendicular to the light beam path 241-4) too far away from the through hole 251 (FIG. 3). If the light beam is blocked at all times during the rotation of the sensor calibration tool 203, then the transmitter-receiver pair 237-4, 239-4 is positioned too close to the through hole 251.

Complete rotation of the calibration tool 203 may not be necessary to accomplish any one or all of the sensor position determinations described above. For example, with regard to any or all of such determinations, a first rotational position of the calibration tool 203 may be predetermined to cause the corresponding portion of the calibration tool 203 to block the light beam when the sensor is properly positioned, a second rotational position of the calibration tool 203 may be predetermined to cause the corresponding portion of the calibration tool 203 to permit passage of the light beam when the sensor is properly positioned, and the first and second rotational positions may be spaced by any angle of rotation. Given such an arrangement, the calibration tool 203 may be caused to toggle between the first and second rotation positions (e.g., as necessary to determine proper/improper positioning and/or to facilitate sensor position adjustment).

Figure 8:
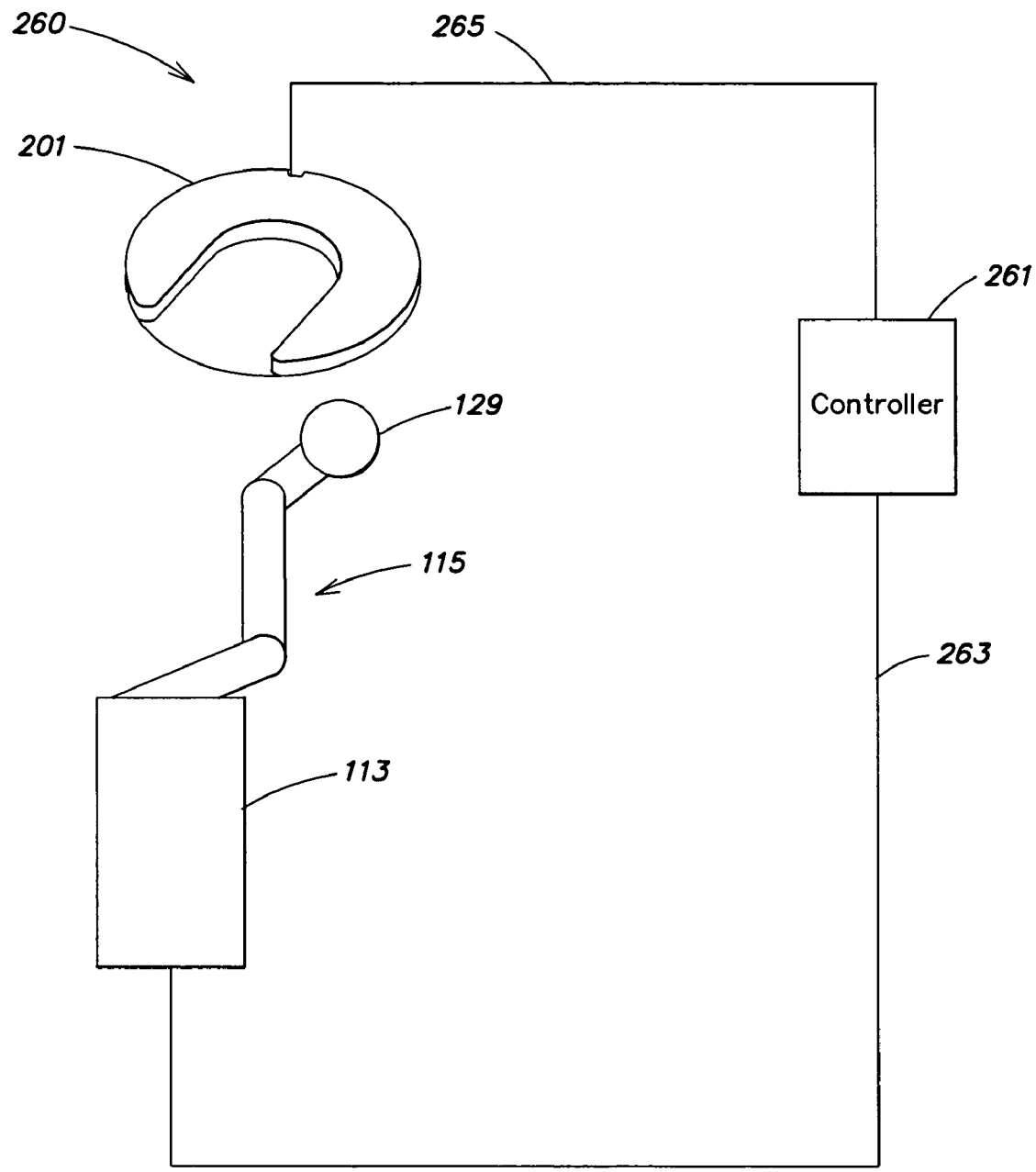
FIG. 8 is a schematic diagram of a system provided in accordance with the invention for self-calibration of a substrate-handling robot.

FIG. 8 is a schematic diagram of a system 260 provided in accordance with the invention for automatically calibrating a substrate handling robot, such as the substrate handling robot 113, that is to be calibrated in accordance with the invention. The robot 113 is coupled to a robot controller 261 (via a signal path 263). The controller 261 may be provided in accordance with conventional principles to control the robot 113 (e.g., similar to the controller 135 of FIG. 2), except that it is also programmed to perform the inventive automatic calibration process described below. For example, the controller 261 may comprise one or more microprocessors or microcontrollers, a dedicated logic circuit, a combination of hardware/software, etc. Also coupled to the controller 261, via a signal path 265, is the calibration fixture 201 described above with reference to FIGS. 3-6. The signal path 265 may comprise, for example, one or more cables (not separately shown) including a cable coupled to the signal port 253 (FIGS. 4 and 5, not shown in FIG. 8), one or more optical fibers, a wireless communications channel, a combination thereof, or any other suitable communications medium. Although not shown in FIG. 8, it will be understood that during a calibration operation, the calibration fixture 201 is installed in a substrate processing location (e.g., a substrate-receiving pocket) of a processing chamber or module, a transfer location of a loading station (e.g., a load lock chamber, a transfer chamber, etc.) or some other substrate placement location.

Figure 9:
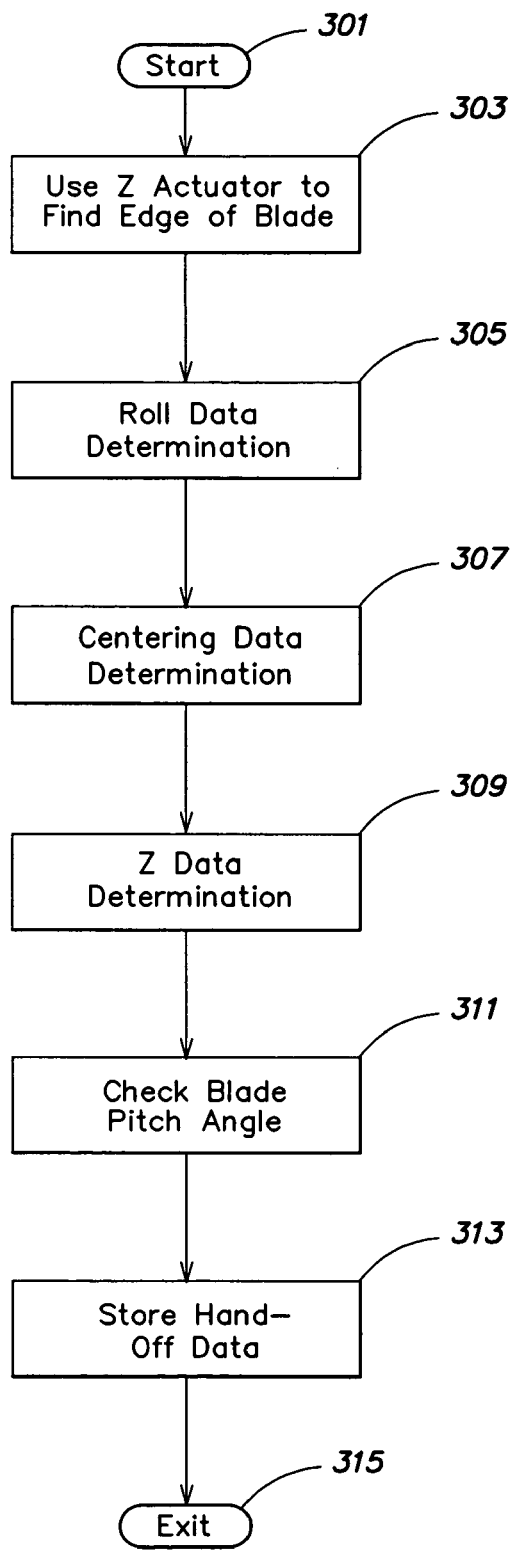
FIG. 9 is a flow chart that illustrates a process, provided in accordance with the invention, for self-calibration of a substrate-handling robot.

FIG. 9 is a flow chart that illustrates an automatic calibration procedure that may be performed by the controller 261 of FIG. 8 in accordance with the present invention. The procedure of FIG. 9 is performed after placement of the calibration fixture 201 in a substrate placement location such as the substrate processing location 107 or transfer location 111 for which hand-off data is to be determined and stored. An operator may indicate to the controller 261 (e.g., by actuating a region of a touch screen) the substrate processing location, transfer location or other substrate placement location for which calibration is to be performed. Alternatively, the controller 261 may make such a determination automatically.

The process of FIG. 9 starts at step 301 and proceeds to step 303. At step 303 the controller 261 causes the robot arm 115 to be moved so that the end effector 129 of the robot arm is approximately at the hand-off position for the substrate placement location for which calibration is being performed. The robot arm 115 is raised or lowered until a first edge (not shown) of the end effector 129 (also sometimes referred to as a "blade") interacts with an appropriate one of the Z-axis sensors (transmitter-receiver pair 237-1, 239-1 or transmitter-receiver pair 237-3, 239-3). If the location for which calibration is being performed is to be serviced by the end effector 129 in a face-up orientation, then the end effector 129 is so oriented during the automatic calibration procedure, and the sensor corresponding to the third light beam path 241-3 (transmitter-receiver pair 237-3, 239-3) is used to find the edge of the end effector 129. If the location for which calibration is being performed is to be served by the end effector 129 in a facedown configuration, then the sensor corresponding to the first light beam path 241-1 (transmitter-receiver pair 237-1, 239-1) is used to find the edge of the end effector 129.

Following step 303 is step 305. At step 305, hand-off parameter data corresponding to a roll or "flip" orientation of the end effector 129 is determined. That is, since the first edge of the end effector 129 was determined at step 303, the second, opposite edge (not shown) is found by rotating the end effector 129 through an appropriate angle (e.g., about 15° or less, or about 10° or less) as indicated by reference numeral 133 in FIG. 2 so as to eliminate the beam blockage caused by the first opposite edge and continue rotating until the second opposite edge of the end effector 129 breaks the light beam that was used to locate the first edge of the end effector 129 at step 303 (e.g., the light beam output by either transmitter 237-1 or 237-3). The respective roll or flip positions of the end effector 129 during detection of the first and second edges of the end effector 129 are recorded. Based on the respective roll or flip positions of the end effector 129, as well as on other relevant information which may be predetermined or contemporaneously determined, such as (a) the (possible non-perpendicular) angle described by the roll axis (not separately shown) of the end effector 129 relative to the corresponding light beam(s), which may be determined or fixed within a certain error range; (b) the particular geometry of the end effector 129 (e.g., substantially round as herein described, or any other type of geometry, such as parallel fingers); and/or (c) the relative height of the opposite first and second edges of the end effector 129 relative to a reference plane (not shown) of the end effector 129, an appropriate intermediate position (e.g., in the case of a perpendicular orientation of the roll axis and symmetric opposite edges, an average position) is calculated to determine roll parameter data for the hand-off position for the substrate placement location for which calibration is being performed.

Following step 305 is step 307. At step 307, horizontal or "centering" hand-off position data, e.g., extension and rotation parameter data, is determined. For example, the end effector 129 is moved so as to alternately interact with the extension sensor (the sensor corresponding to the second light beam path 241-2 that includes transmitter-receiver pair 237-2, 239-2), and with the rotation sensor (the sensor corresponding to the fourth light beam path 241-4 that includes transmitter-receiver pair 237-4, 239-4) until the end effector 129 is positioned as illustrated as in FIG. 5 with its circumference tangent to the light beams of both the extension and rotation sensors (transmitter-receiver pairs 237-2, 239-2 and 237-4, 239-4, respectively). The corresponding extension and rotation position data are then stored for the hand-off position of the substrate placement location for which calibration is being performed.

With centering complete, step 309 follows, at which Z-position "fine-tuning" is performed to determine the Z-axis parameter data for the hand-off position. That is, the first edge of the end effector 129 is again found using the appropriate one of the two Z-axis sensors (transmitter-receiver pair 237-1, 239-1 or 237-3, 239-3), and a suitable offset is applied, depending on the geometry and operation of the substrate placement location for which calibration is being performed. In one particular embodiment, an offset of 23.875 mm may be suitable (e.g., depending on the type of processing tool being employed) and the offset may be applied by subtracting or adding the offset to the Z-position of the robot 113 (FIG. 2) when the first edge of the end effector 129 is found by the corresponding Z-axis sensor. Other offsets may be used. The resulting data is then stored as Z-axis (e.g., height) data by the controller 261.

Figure 10:
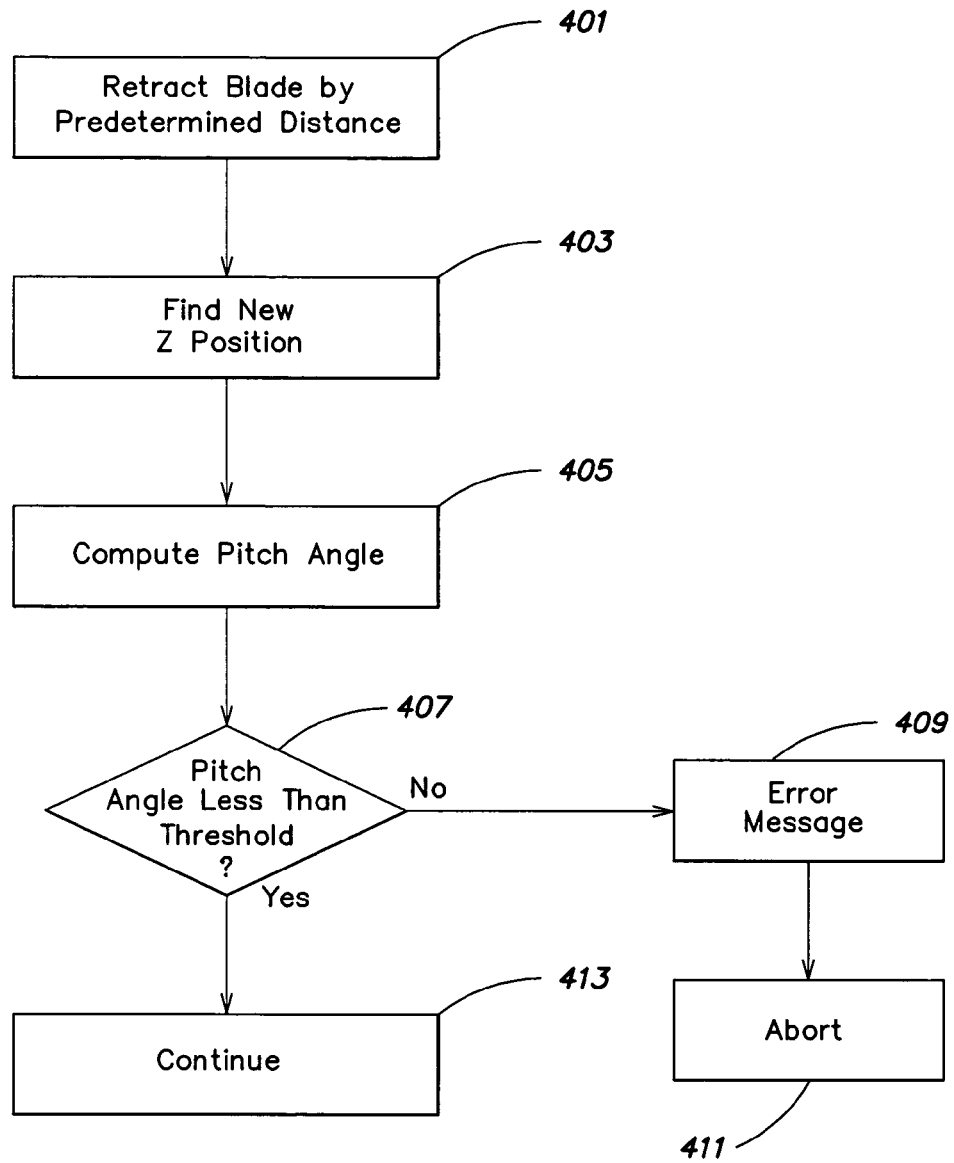
FIG. 10 is a flow chart that illustrates details of a portion of the inventive process of FIG. 9 relating to checking a pitch angle of a robot end effector.

Following step 309 is step 311. At step 311, it is determined whether the pitch angle of the end effector 129 (i.e., the divergence, if any, of the end effector 129 from horizontal about an axis that is perpendicular to the direction of extension of the robot arm 115) is within a predetermined range. Details of step 311 will now be described with reference to FIG. 10, which is a flow chart that illustrates sub-steps which may be employed during step 311. Initially, in sub-step 401, the end effector 129 is retracted (i.e., moved toward the hub 121 (FIG. 2) by a predetermined distance). In at least one embodiment, the predetermined distance of retraction may be about 27 mm (e.g., being a distance less than a radius of the end effector 129, which may be about 37.5 mm), although other retraction distances may be employed (e.g., based on the desired accuracy, the size of the hand-off location, the dimensions and/or geometry of the particular end effector used, etc.). Sub-step 403 follows, at which the Z-axis sensor (transmitter-receiver pair 237-1, 239-1 or 237-3, 239-3) that was used to find the Z-axis parameter data at step 309 is again used to find the Z-axis positioning of the end effector 129 while the end effector 129 is in its retracted position. The pitch angle of the end effector 129 (e.g., the degree to which the roll axis of the end effector 129 deviates vertically from a (nominally) horizontal plane described by the substrate when in the substrate hand-off position) then may be calculated (sub-step 405). For example, the pitch angle may be calculated by taking the arctangent of the difference in Z positions between steps 309 and 403 divided by the distance the end effector 129 was retracted in sub-step 401.

Following sub-step 405 is a decision block 407, at which it is determined whether the pitch angle computed at sub-step 405 is less than a predetermined threshold. In one embodiment of the invention, the predetermined threshold may be about 1.2 degrees, although other thresholds may be employed.

If a negative determination is made at decision block 407, that is, if the pitch angle is not less than the predetermined threshold, then an error message may be generated (sub-step 409) and the calibration procedure of FIG. 9 may be aborted (sub-step 411). An operator then may adjust the robot arm 115 to bring the pitch angle within the pre-determined pitch angle range (relative to the substrate placement location in question).

If at decision block 407 it is determined that the pitch angle is less than the predetermined threshold, then sub-step 413 follows, resulting in continuation of the process of FIG. 9.

Referring again to FIG. 9, step 313 follows the checking of the end effector pitch angle at step 311. At step 313, any data determined at steps 305-309 that was not previously stored is stored (e.g., roll parameter data, extension parameter data, rotation parameter data, Z-axis parameter data). The auto calibration process then ends, as indicated at 315.

One advantage provided by the automatic calibration procedure of the present invention is a significant reduction in the time required for calibrating a substrate handling robot for a processing tool. For example, a reduction in time required for robot calibration by a factor of about seven has been found in some instances. Moreover, employing the present invention, calibration may be performed by only one person, rather than requiring two or more people. Consequently, in the above mentioned instances, a savings of up to about fourteen person hours has been realized using the present invention.

Although the present invention has been illustrated in the context of a single-arm robot, the principles of the present invention are also applicable to dual-arm robots (e.g., a Rorze RR721 Dual Arm Robot available from Rorze Automation, Inc. or the like). For example, the present invention may be employed with substrate-handling robots of the type in which two arms are mounted on a common hub, and are raised, lowered and/or rotated together, but are extendable separately from each other. In such a robot, a pitch actuator (e.g., in the wristblock of one of the robot arms, not shown) may be employed to adjust an angular displacement in a horizontal plane between the two robot arms, and/or an effective linear displacement in a horizontal plane between the end effectors of the two robots. For example, the latter adjustment may be made by the pitch actuator of one of the robots when the two robot arms are utilized to simultaneously service side-by-side processing locations where the corresponding extension/retraction axes (see double arrow 117 of FIG. 2) of the two robot arms are essentially parallel and must be separated by a predetermined distance, such as with side-by-side processing locations separated by a 500 mm center-to-center pitch.

A dual arm robot of this type may be employed, for example, to transport two wafers at a time (one wafer carried by each arm) to a pair of adjacent processing locations. In applying the present invention to such a robot, calibration data may first be generated for one of the two arms, with respect to one processing location of the adjacent pair of processing locations, in the manner similar to that described above with connection to FIG. 9. Upon completion of the calibration for the first arm (with respect to the first processing location of the pair of processing locations), calibration of the second arm with respect to the second processing location of the pair of processing locations may proceed in a similar manner, except that the rotational (horizontal rotation) position of the second arm, and/or the axial (horizontal linear) position of the end effector of the second arm, for calibration purposes may be performed using a pitch actuator of the second arm (e.g., located within a wristblock of the second arm) instead of the rotational capability of the robot hub.

Another advantage of the inventive calibration fixture and the inventive automatic calibration procedure described above is that calibration may be performed with greater precision (e.g., greater repeatability) than with conventional manual calibration techniques.

In at least one embodiment of the invention, the above-described calibration fixture and calibration process may be employed to calibrate a mainframe robot of an integrated system such as the iECP tool available from Applied Materials, Inc. or a similar robot configuration. The iECP tool has a total of 12 wafer handoff locations that include (i) two loading stations (e.g., in-stations); (ii) two cleaning chambers (e.g., iClean chambers); (iii) four plating cells; (iv) two bevel cleaning chambers (e.g., integrated bevel clean (IBC) chambers); and (v) two spin rinse dry (SRD) chambers. A total of five positions (e.g., flip, z-up, z-down, rotation and extension) must be determined at each of these handoff locations. Prior to the present invention, calibrating relative to all twelve handoff locations was performed manually, took approximately fourteen hours and required two operators.

Through use of the present invention, calibration of the iECP mainframe robot relative to all twelve handoff locations can be reduced to about 42-54 minutes (compared to 14 hours via the conventional calibration process). In one experiment, 10 calibrations were performed using the present invention with the following repeatability in z-axis data, flip data, rotational data and extension data: z-axis data=0.12 mm (+/−0.06 mm); flip data=0.23 degrees (+/−0.125 degrees); rotational data=0.28 mm (+/−0.14 mm); and extension data=0.22 mm (+/−0.11 mm).

Figure 11:
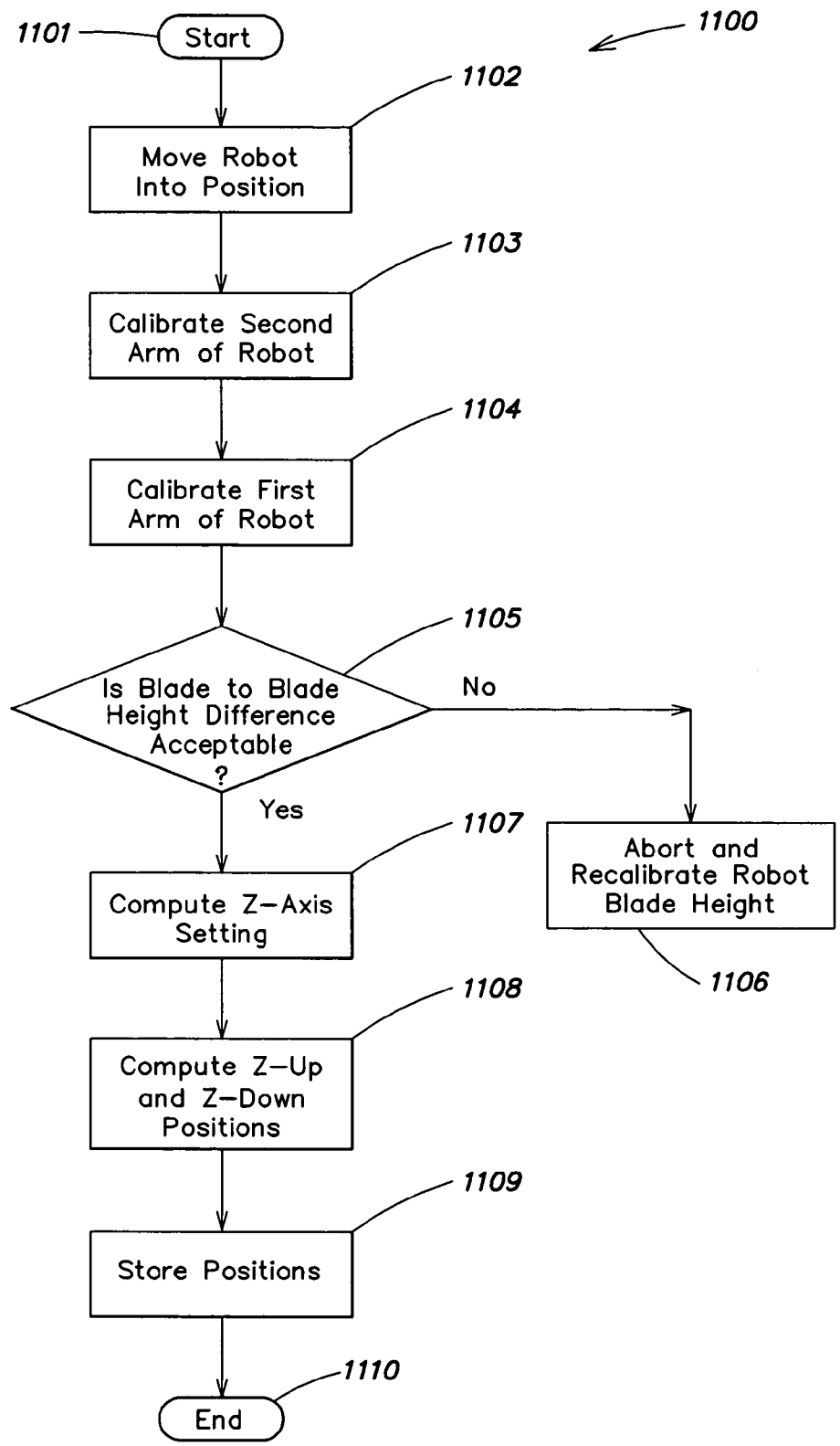
FIG. 11 illustrates an exemplary calibration procedure for a dual arm, iECP mainframe robot that may be employed to calibrate each robot arm relative to in-stations of an iECP system.

FIG. 11 illustrates an exemplary calibration procedure 1100 for a dual arm, iECP mainframe robot that may be employed to calibrate each robot arm relative to in-stations of an iECP system. A similar process may be employed to calibrate each robot arm of an iECP mainframe robot relative to the integrated bevel cleaners of an iECP system.

With reference to FIG. 11, the in-station calibration procedure 1100 begins with step 1101. For example, a first calibration fixture 201 (FIG. 3) may be placed at a substrate placement location of a first in-station and a second calibration fixture 201 may be placed at a substrate placement location of a second in-station. In the iECP tool, each in-station includes a lower substrate receiving pocket and an upper substrate receiving pocket; and in at least one embodiment of the invention, the calibration fixture 201 is adapted to be placed in the lower substrate receiving pocket of each in-station. Preferably the operation of the sensors of each calibration fixture is verified.

At step 1102, the first and second robot arms are each moved into position relative to a substrate placement location of an in-station. For example, each end effector of each robot arm may be moved so as to break a light beam path of a z-up and/or z-down sensor of a respective calibration fixture 201. Typically, substrates are loaded into or removed from in-stations of the iECP tool with end effectors in a face-up configuration.

In step 1103, the handoff positions for the second arm of the robot are found (e.g., flip, extension, rotation and/or z-height data) as described previously with reference to FIG. 9. Thereafter, in step 1104, the handoff positions for the first arm of the robot are found (e.g., flip, extension, pitch of pitch actuator of robot arm (rather than rotation of the main hub of the robot), and/or z-height data) as described previously with reference to FIG. 9.

In step 1105, the z-height positions of the first and second robot arms are compared. If the height difference between the first and second positions is greater than a predetermined threshold value, the process 1100 is aborted at step 1106 to allow recalibration of robot blade height (e.g., manually); otherwise, the process 1100 proceeds to step 1107. An error message identifying the need to recalibrate blade-to-blade z-height may be generated during step 1106 if desired. For example, a height difference on the order of 2-5 mm may be the predetermined threshold value for an acceptable height difference, and factors such as the capacity of the substrate and/or the end effector to absorb stress without fracture or damage (e.g., due to the end effector having not released a substrate that has been lowered or raised to its drop-off position and being urged further in the drop-off direction, creating stress in the substrate and/or the end effector) may influence the selection of such a predetermined threshold value. Other threshold values may be used.

Assuming the z-height difference is less than the predetermined threshold value, in step 1107 the z-axis settings for each robot arm are found as a function of individual arm position (e.g., as determined via steps 1103 and 1104) and in step 1108 the $Z_{UP}$ and $Z_{DOWN}$ positions for each arm are determined (e.g., as a function of the z-axis settings determined at step 1107). In at least one embodiment of the invention, the z-axis settings and the $Z_{UP}$ and $Z_{DOWN}$ positions for each robot arm may be determined via the following formulas:

For lower pocket of each in-station:

$$Z_{UP,LS} = \text{greater of } [Z_{UP,ARM1}, \text{ and } Z_{UP,ARM2}] - Z_{OFFSET1}$$

$$Z_{DOWN,LS} = Z_{UP} - Z_{OFFSET2}$$

For upper pocket of each in-station:

$$Z_{UP,US} = Z_{UP,LS} + Z_{OFFSET3}$$

$$Z_{DOWN,US} = Z_{DOWN,LS} + Z_{OFFSET3}$$

Wherein:
- $Z_{UP,LS}$=upper entry position for lower station pocket;
- $Z_{DOWN,LS}$=lower entry position for lower station pocket;
- $Z_{UP,ARM1}$=Z-position determined for first robot arm during step 1104 (e.g., entry position of first arm);
- $Z_{UP,ARM2}$=Z-position determined for second robot arm during step 1103;
- $Z_{UP,US}$=upper entry position for upper station pocket;
- $Z_{DOWN,US}$=lower entry position for upper station pocket;
- $Z_{OFFSET1}$=first offset due to difference between calibration fixture sensor positions and actual chucking position of in-station (e.g., 23.875 mm in one embodiment, although other values may be employed);
- $Z_{OFFSET2}$=second offset due to difference between $Z_{UP}$ and $Z_{DOWN}$ positions; and
- $Z_{OFFSET3}$=third offset due to difference between height of upper and lower substrate receiving pockets of in-stations.

In step 1109, all position information for the robot arms is stored; and in step 1110, the process 1100 ends.

Figure 12:
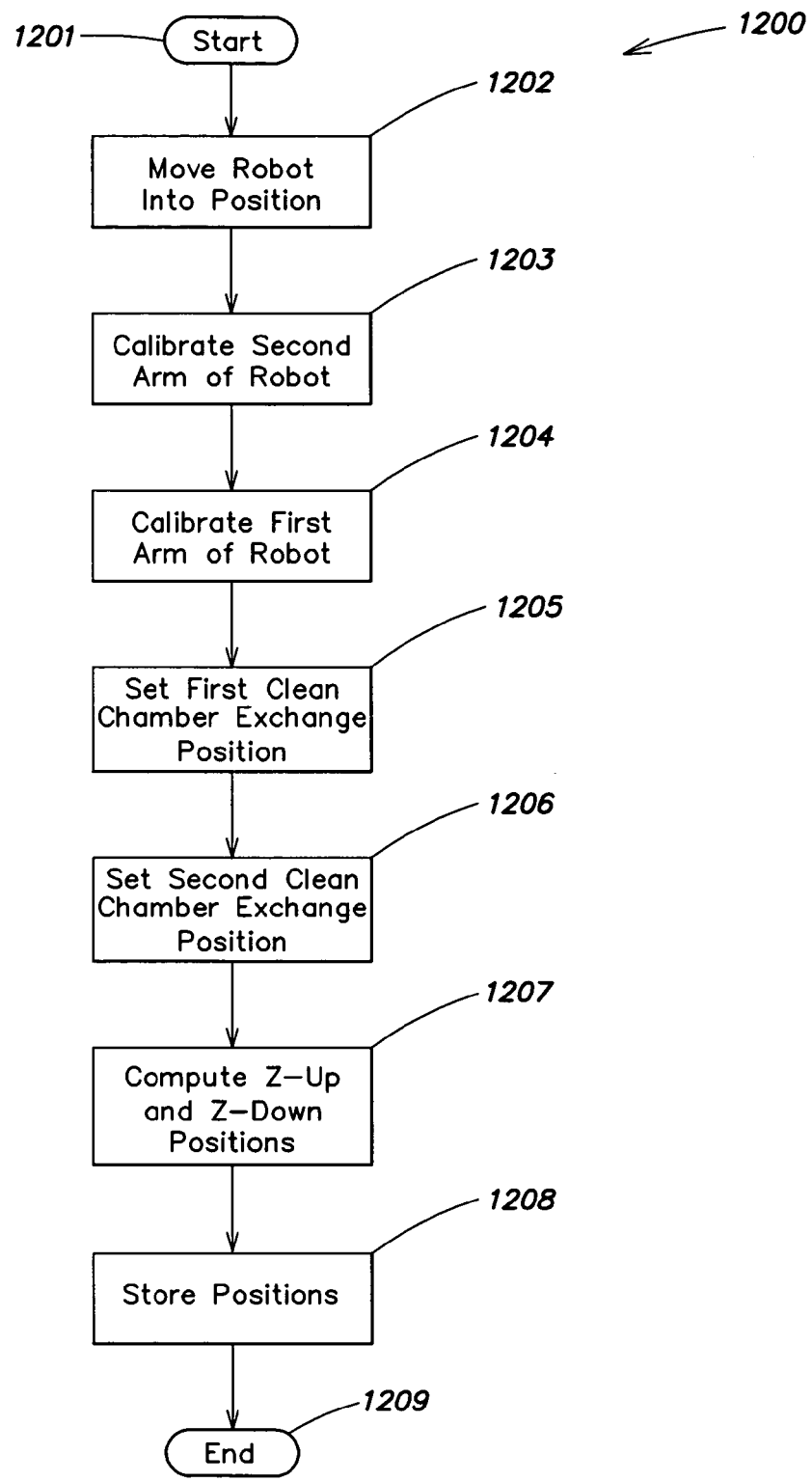
FIG. 12 illustrates an exemplary calibration procedure for a dual arm, iECP mainframe robot that may be employed to calibrate each robot arm relative to a cleaning chamber of an iECP system.

FIG. 12 illustrates an exemplary calibration procedure 1200 for a dual arm, iECP mainframe robot that may be employed to calibrate each robot arm relative to a cleaning chamber of an iECP system (e.g., an iClean chamber). A similar process may be employed to calibrate each robot arm of an iECP mainframe robot relative to spin rinse dryer and plating cell substrate placement positions of an iECP system.

With reference to FIG. 12, the cleaning chamber calibration procedure 1200 (e.g., for an iClean chamber, available from Applied Materials, Inc.) begins with step 1201. For example, a first calibration fixture 201 (FIG. 3) may be placed at a substrate placement location of a first cleaning cell and a second calibration fixture 201 may be placed at a substrate placement location of a second cleaning cell. Preferably the operation of the sensors of each calibration fixture is verified.

At step 1202, the first and second robot arms are each moved into position relative to a substrate placement location of a cleaning cell. For example, each end effector of each robot arm may be moved so as to break a light beam path of a z-up and/or z-down sensor of a respective calibration fixture 201.

In step 1203, the handoff positions for the second arm of the robot are found (e.g., flip, extension, rotation and/or z-height data) as described previously with reference to FIG. 9. Thereafter, in step 1204, the handoff positions for the first arm of the robot are found (e.g., flip, extension, pitch of pitch actuator of robot arm (rather than rotation of the main hub of the robot), and/or z-height data) as described previously with reference to FIG. 9.

In step 1205, the exchange position for the first cleaning cell is determined, and in step 1206 the exchange position for the second cleaning cell is determined. In at least one embodiment of the invention, the exchange position for each cleaning cell may be determined via the formula:

$$Z_{cell} = (Z_1 + Z_2)/2 - Z_{offset}$$

wherein:
- $Z_{cell}$=robot chucking position for each cell;
- $Z_1$ and $Z_2$=robot z-positions determined during steps 1204 and 1203 for the first and second arms, respectively; and
- $Z_{offset}$=an offset due to a difference in position between the chucking position of a cell and the position found via use of the calibration fixture (e.g., about 3.5 mm in one embodiment).

In step 1207, the z-up and z-down positions for each cleaning cell may be determined, e.g., given the appropriate offset, and by applying formulas and accounting for variables in a manner similar to the manner described above.

In step 1208, all position information for the robot arms is stored; and in step 1209, the process 1200 ends. Other calibration procedures may be employed using the calibration fixture 201.

The foregoing description discloses only exemplary embodiments of the invention; modifications of the above disclosed apparatus and methods which fall within the scope of the invention will be readily apparent to those of ordinary skill in the art. For example, more or fewer than the four sensors shown in the drawings may be provided in the calibration fixture. Moreover, the positions of the sensors may be changed. A sensor that is used for determining extension or rotation parameter data may also be used to determine Z-axis parameter data. Only one Z-axis sensor may be provided, instead of the two Z-axis sensors shown in the drawings. For example, if the robot to be calibrated operates with its end-effector only in a face-up or only in a face-down orientation, one Z-axis sensor may be employed.

Accordingly, while the present invention has been disclosed in connection with exemplary embodiments thereof, it should be understood that other embodiments may fall within the spirit and scope of the invention as defined by the following claims.

The invention claimed is:

1. A method comprising;
    placing a calibration fixture in a substrate placement location, the calibration fixture including at least one sensor;
    causing an end effector of a substrate handling robot to interact with the at least one sensor; and
    based on the interaction between the end effector and the at least one sensor, determining calibration data for the substrate handling robot.

2. The method of claim 1, wherein the calibration data is indicative of at least one hand-off location at which the robot is to hand-off a substrate to the substrate placement location.

3. The method of claim 1, wherein the causing step includes causing the end effector to break a light beam emitted by the at least one sensor.

4. The method of claim 1, wherein the substrate placement location is part of a plating device.

5. The method of claim 4, wherein the substrate placement location is part of a plating module included in the plating device.

6. The method of claim 4, wherein the substrate placement location is part of a cleaning module included in the plating device.

7. The method of claim 4, wherein the substrate placement location is part of a spin-rinse-drying module included in the plating device.

8. The method of claim 1, wherein the calibration data includes at least one of height data, extension data and rotation data.

9. The method of claim 1, wherein the calibration data includes height data, extension data, and rotation data.

10. The method of claim 9, wherein the calibration data also includes pitch data indicative of an angular offset between two arms of the substrate handling robot.

11. The method of claim 9, wherein the height data includes data indicative of a first elevation and indicative of a second elevation.

12. The method of claim 9, where in the calibration data includes data indicative of a roll orientation of the end effector.

13. The method of claim 1, wherein the fixture includes a body having a shape that substantially corresponds to a shape of the substrate placement location.

14. The method of claim 13, wherein the body is cylindrically shaped.

15. The method of claim 1, wherein the fixture includes a body having a profile that substantially corresponds to a profile of a substrate to be processed in the substrate placement location.

16. The method of claim 1, wherein the placing step includes inserting the calibration fixture in a pocket of the substrate placement location, the pocket being shaped and sized to receive a substrate to be processed at the substrate placement location.

17. A method comprising;
providing a calibration fixture having a body with an opening that extends from an edge of the body to at least a center of the body, the calibration fixture including a plurality of sensors mounted in the body so as to define respective light beam paths across the opening;
placing the calibration fixture in a substrate-placement location of a substrate processing station;
establishing a signal path between the sensors and a controller that is operatively coupled to a substrate-handling robot;
controlling the substrate handling robot to move an end effector of the substrate-handling robot so as to selectively obstruct at least one of the light beam paths;
receiving signals from at least one of the sensors, the received signals indicating the obstructing of the at least one of the light beam paths by the end effector;
on the basis of the received signals, determining hand-off location data for the substrate processing station, the hand-off location data including:
(i) data which defines an elevation parameter for the substrate handling robot;
(ii) data which defines an extension parameter for the substrate handling robot; and
(iii) data which defines a rotation parameter for the substrate handling robot; and
storing the hand-off location data.

18. The method of claim 17, wherein the hand-off location data further includes data which defines a first elevation parameter for the substrate handling robot and data which defines a second elevation parameter for the substrate handling robot.

19. The method of claim 17, wherein the plurality of sensors includes at least four sensors.

20. The method of claim 19, wherein three of the sensors are mounted in the body so as to define respective light beam paths that are substantially parallel to each other, and a fourth one of the sensors is mounted in the body so as to define a light beam path that is angled relative to the light beam paths of the other three sensors.

21. The method of claim 20, wherein:
a first one of the three sensors is mounted in the body at a first height;
a second one of the three sensors is mounted in the body at a second height that is lower than the first height;
a third one of the three sensors is mounted in the body at a third height that is lower than the second height; and
the fourth sensor is mounted in the body at substantially the second height.

22. The method of claim 17, wherein the providing step includes:
placing a sensor calibration tool within the body of the calibration fixture; and
mounting the sensors in the body of the calibration fixture at respective positions that are determined by using the sensor calibration tool.

23. An apparatus for use during calibration of a substrate handling robot comprising:
a body shaped to fit a substrate placement location; and
at least one sensor mounted in the body, the at least one sensor adapted to generate calibration data for a substrate handling robot during calibration of the substrate handling robot.

24. The apparatus of claim 23, wherein the body has an opening formed therein adapted to receive an end effector of the substrate handling robot.

25. The apparatus of claim 24, wherein the at least one sensor includes a plurality of sensors that define respective light beam paths across the opening.

26. The apparatus of claim 25, wherein the plurality of sensors are adapted to determine calibration data that includes:
(i) data which defines an elevation parameter for the substrate handling robot;
(ii) data which defines an extension parameter for the substrate handling robot; and
(iii) data which defines a rotation parameter for the substrate handling robot.

27. A system comprising;
a calibration fixture which includes a body shaped to fit a substrate placement location and at least one sensor mounted in the body;
a substrate handling robot; and
a controller coupled to the at least one sensor and to the substrate handling robot and operative to:
cause an end effector of the substrate handling robot to interact with the at least one sensor; and
determine hand-off location data for the substrate handling robot based on signals output from the at least one sensor.

* * * * *